(12) United States Patent
Roth et al.

(10) Patent No.: US 8,324,955 B2
(45) Date of Patent: Dec. 4, 2012

(54) LEVEL SHIFTER DESIGN

(75) Inventors: Alan Roth, Leander, TX (US);
Ying-Chih Hsu, Taichung (TW); Justin Shi, Ann Arbor, MI (US); Eric Soenen, Austin, TX (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 74 days.

(21) Appl. No.: 13/051,343

(22) Filed: Mar. 18, 2011

(65) Prior Publication Data

US 2012/0235728 A1    Sep. 20, 2012

(51) Int. Cl.
*H03L 5/00* (2006.01)
(52) U.S. Cl. ........................ 327/333; 326/80; 365/189.11
(58) Field of Classification Search ............... 326/62, 326/63, 68, 80, 81; 327/333; 365/189.11
See application file for complete search history.

(56) References Cited

U.S. PATENT DOCUMENTS

| | | | |
|---|---|---|---|
| 5,440,258 A | 8/1995 | Galbi et al. | |
| 6,580,291 B1 | 6/2003 | Lutley | |
| 6,600,679 B2 | 7/2003 | Tanzawa et al. | |
| 7,279,931 B2 | 10/2007 | Lee et al. | |
| 7,511,554 B2 * | 3/2009 | Kaneko et al. | 327/333 |
| 7,649,384 B2 | 1/2010 | Ho et al. | |
| 2011/0031944 A1 * | 2/2011 | Stirk et al. | 323/234 |

FOREIGN PATENT DOCUMENTS

JP    2007174251 A  *  7/2007

* cited by examiner

*Primary Examiner* — Lincoln Donovan
*Assistant Examiner* — William Hernandez
(74) *Attorney, Agent, or Firm* — Slater & Matsil, L.L.P.

(57) ABSTRACT

A level shifter receives an input voltage signal and produces an output voltage signal. The level shifter includes a first inverter, configured to operate at a potential difference between a first voltage V1 and a second voltage V2. The output from the invert is capacitively coupled to an input of a latch circuit via a capacitor. The capacitor has a first terminal connected to the output terminal of the first inverter, and further has a second terminal. The level shifter has a resistor connected to a third voltage V3 and to the capacitor for tying the input to the latch circuit to a desired voltage. The latch circuit is configured to operate at a potential difference between a fourth voltage V4 and a fifth voltage V5. The latch has an input node connected to the resistor and the capacitor, and further has an output node connected to an output node of the level shifter.

21 Claims, 11 Drawing Sheets

LEVEL SHIFTER DESIGN

TECHNICAL FIELD

The present invention relates generally to digital circuits and more particularly to level shifting circuits for shifting digital signals between two different voltage levels.

BACKGROUND

The field-effect-transistor (FET, or transistor) uses either electrons (in N-channel FET) or holes (in P-channel FET) for conduction. The four terminals of a transistor are source, gate, drain, and body (substrate). In transistors, the drain-to-source current flows via a conducting channel that connects the source region to the drain region. The conductivity is controlled by the electric field that is produced when a voltage is applied between the gate and source terminals, denoted by $V_{gs}$. Usually, the body terminal is connected to the highest or lowest voltage within the circuit. The body terminal and the source terminal are sometimes connected together since the source is also sometimes connected to the highest or lowest voltage within the circuit. Normally, an input signal is applied to the gate terminal of a transistor, and an output signal is connected to the source or the drain terminal of a transistor. A first terminal of a transistor can be either its source terminal or its drain terminal, and a second terminal of a transistor is the drain or source terminal of the transistor.

A digital circuit accepts input signals and produces output signals, both could be represented by certain allowed voltages. A flip-flop (a latch) is a circuit that has two stable states and can be used to store state information. The latch circuit can be made to change state by signals applied to one or more control inputs and will have one or two outputs.

In digital circuits, a logic level is one of a finite number of states that a signal can have. Logic levels are usually represented by the voltage difference between the signal and ground (or some other common reference point), although other standards exist. The range of voltage levels that represents each state depends on the logic family being used. An active-high signal represents a binary digit of 1, or asserted state of a logical condition, by the higher of two voltages. An active-low signal represents a binary digit of 0, or asserted state of a logical condition, by the lower of two voltages. In three-state logic, an output device can also be high impedance. This is not a logic level, but means that the output is not controlling the state of the connected circuit. A level shifter connects one digital circuit that uses one logic level to another digital circuit that uses another logic level.

Manufacturers have developed different processes to produce Integrated Circuits (IC) that operate at different voltage levels. Some common IC operating voltage levels include 5V+/−10%, 3.3V+/−10%, and 2.5V+/−10%. In using decreased voltage levels, manufacturers limit the adverse effects of power dissipation (e.g., heat), while continuing to allow for ever increasing IC densities.

Nevertheless, when a new, low-voltage IC process technology emerges, it is often desirable for the new technology to be able to operate with existing high-voltage levels. IC process technologies, and their respective operating voltages, are often defined by the gate-oxide breakdown voltage between the terminals of a device (e.g., a transistor) implemented using the particular process technology. Consequently, a potential problem with interfacing circuitry implemented in a low-voltage process technology with a voltage that exceeds device limits is that, one or more devices implemented in the low-voltage process may experience damage, either temporary or permanent, that can hinder the circuit's ability to perform its desired function.

A voltage level shifter can function as a high-voltage tolerant output driver providing the ability to regulate an input voltage $V_{IN}$ that may exceed the maximum operating voltage of the process technology. Without high-voltage tolerant output driver, exceeding the device voltage limits dictated by the process technology may result in damage of devices.

BRIEF DESCRIPTION OF THE DRAWINGS

For a more complete understanding of the present invention, and the advantages thereof, reference is now made to the following descriptions taken in conjunction with the accompanying drawings, in which.

The drawings, schematics and diagrams are illustrative and not intended to be limiting, but are examples of embodiments of the invention, are simplified for explanatory purposes, and are not drawn to scale.

DETAILED DESCRIPTION OF ILLUSTRATIVE EMBODIMENTS

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments.

Illustrative embodiments will be discussed with respect to a level shifter design, which are implemented using nMOS transistors, pMOS transistors, invertors, and other basic logic circuits. Those of skill in the art will readily recognize that there are many variations which implement equivalent functions and the illustrative embodiments are made for illustrative purpose only.

Figure 1:
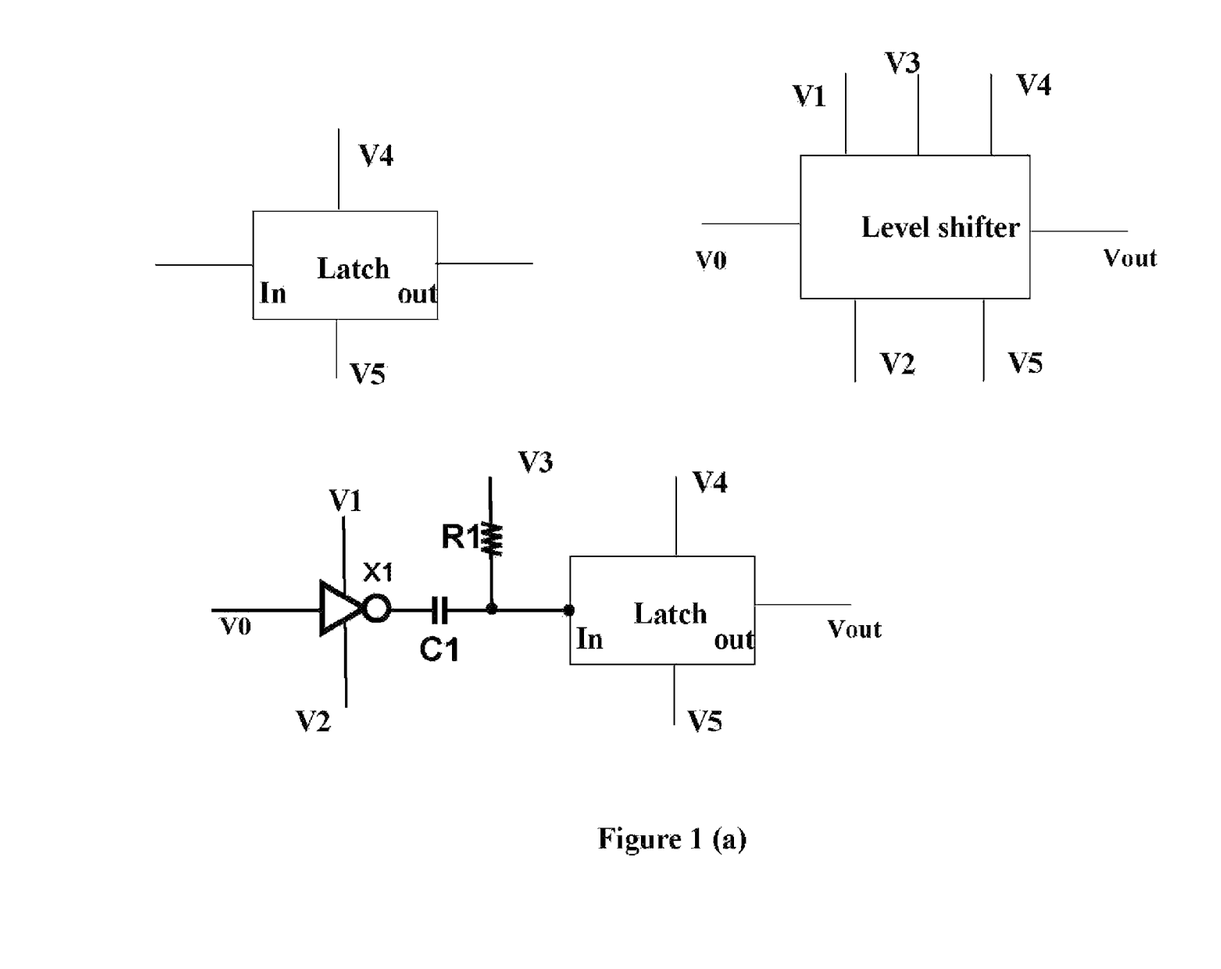
FIGS. 1(a)-(c) depict illustrative block diagrams of exemplary embodiments of level shifter circuits in various details.

FIG. 1(a) illustrates a block diagram of an illustrative embodiment of a level-shifter circuit. The circuit comprises a first inverter X1, a capacitor C1, a resistor R1, and a latch circuit "latch". The first inverter X1, operates with a potential difference between a first voltage V1 and a second voltage V2, and has an input terminal connected to the input signal node V0 of the level shifter, and an output terminal connected to a first terminal of the capacitor C1. The capacitor C1 has a second terminal connected to an input node of the latch. The resistor R1 has a first terminal connected to a third voltage node V3 and a second terminal connected to the input node of the latch. Finally, the latch circuit operates under a potential difference between a fourth voltage V4 and a fifth voltage V5, and has an output node connected to the output signal node Vout of the level shifter. The input signal V0 has a voltage value in the range of between V1 and V2, while the output signal Vout of the level shifter has a voltage value in the range of between V4 and V5. Some of the voltage levels V1 to V5 may be the same depending on the application being used for. Some of the voltages V1 to V5 may be active high or active low voltage signals. For illustrative purpose, the value of V5 is smaller than the value of V4, and the value of V2 is smaller than the value of V1. An abstract block diagram showing only the related operating voltage signals V1 to V5, an input voltage signal V0, and an output voltage signal Vout is also presented in FIG. 1(a) for representing the illustrative level shifter.

FIG. 1(b) is an illustrative circuit diagram showing more details of an exemplary arrangement of a level shifter according to the first embodiment of FIG. 1(a). The latch circuit "latch" of FIG. 1(a) is illustratively implemented by a loop of two inverters X2 and X3 in FIG. 1(b). An output terminal of the inverter X2 is connected to an input terminal of the inverter X3 while an output terminal of the inverter X3 is connected to an input terminal of the inverter X2. The inverters X2 and X3 are driven with a potential difference between a voltage V4=VH and a voltage V5=VL, where VH is larger than VL. The Resistor R1 has a first terminal connected to the voltage V3=VH as well. Furthermore, the inverter X1 is driven with a potential difference between a voltage V1=Vh and a ground voltage V2. VIP is the input signal node of the level shifter and DRV_P is the output signal node of the level shifter.

Those of skill in the art will readily recognize that there are many variations which implement equivalent functions and the illustrative embodiments are made for illustrative purpose only. The latch can be implemented by other flip-flop circuits other than the two inverter loop.

The operation of the level shifter shown in FIG. 1(b) is as follows. As set out above, one terminal of the latch circuit comprised of the inverters X2 and X3 is indicated by the node VX and the other terminal of the latch circuit is connected to the node DRV_P. Further, the output terminal of the inverting element X1 is indicated by a node Va. VC1 denotes a potential difference across the capacitor C1.

Let it be assumed that, at an initial state, a voltage Vss lower than a circuit threshold value of the inverter X1 is inputted as an input signal VIP to the inverter X1. In this case, a voltage Vh is outputted from the inverter X1 and a potential on the node Va becomes a voltage Vh. Since the node VX is set to a voltage VH, a potential difference VC1 across the capacitor C1 becomes a potential |Vh−VH|, and the potential of DRV_P is of the voltage VL.

Next, assume a voltage Vcc higher than the circuit threshold value of the inverter X1 is inputted as an input signal VIP to the inverter X1. Then, from the inverter X1 a voltage V2 (in this case, ground) is outputted and the node Va is set to a voltage ground=V2. When a potential on the node Va varies from the voltage Vh to a voltage V2, a potential difference VC1 across the capacitor C1 is momentarily held to |Vh−VH| and, due to a capacitive coupling, a potential on the node Va causes a transition on Vx to be VH−(Vh−V2)=VH−Vh, since V2=ground voltage.

If, here, the respective voltages VH, VL, Vh and ground voltage are so set as to make a potential on the node VX lower than the threshold voltage of X1, that is, VH−Vh<(VH+VL)/2, then the potential on the node VX and potential on the node DRV_P are inverted, so that the node VX is set to VL and the node DRV_P is set to a voltage VH. When the potential on the node VX and potential on the DRV_P are inverted and become stable, the potential difference VC1 becomes VL.

Furthermore, assume a voltage Vss lower than a circuit threshold value of the inverter X1 is next inputted as an input signal VIP to the inverter X1. Then, from the inverter X1 a voltage Vh is outputted and the node Va is set to a voltage Vh. When a potential on the node Va varies from the ground voltage V2 to a voltage Vh, a potential difference VC1 across the capacitor C1 is held to be VL, and, due to a capacitive coupling, a potential on the node Va causes a transition on Vx to be VL+Vh.

If, here, the respective voltages VH, VL, Vh and ground voltage are so set as to make a potential on the node VX lower than the threshold voltage of X3, that is, VL+Vh<(VH+VL)/2, then the potential on the node VX and potential on the node DRV_P are inverted, so that the node VX is set to VH and the node DRV_P is set to a voltage VL. When the potential on the node VX and potential on the DRV_P are inverted and become stable, the potential difference VC1 becomes VH−Vh. The purpose of R1 is to define the input of the latch to high level during high-impedance input.

The limitation of the voltage levels of FIG. 1(b) is as below:

For $VH$, $VL$, and $Vh > 0$ $$\text{when } DRV\_P = VL \begin{cases} Vh > \dfrac{VL+VH}{2} \\ VH > \dfrac{VL+VH}{2} \\ Vh+VL > \dfrac{VL+VH}{2} \end{cases} \Rightarrow \begin{cases} VH < 2Vh - VL \\ VH > VL \\ VH < 2Vh + VL \end{cases}$$

$$\text{when } DRV\_P = VH \begin{cases} VH - Vh < \dfrac{VL+VH}{2} \\ VL < \dfrac{VL+VH}{2} \end{cases} \Rightarrow \begin{cases} VH < 2Vh + VL \\ VH > VL \end{cases}$$

$$\Rightarrow VL < VH < 2Vh - VL$$

FIG. 1(c) is an illustrative circuit diagram showing more details of an exemplary arrangement of a level shifter according to the first embodiment of FIG. 1(a). The inverter X1 is driven with a potential difference between a voltage Vh and a ground voltage. The resistor R1 has a first terminal connected to the ground voltage as well. The latch circuit "latch" of FIG. 1(a) is further illustratively implemented by a loop of two inverters X2 and X3 in FIG. 1(c). An output terminal of the inverter X2 is connected to an input terminal of the inverter X3 while an output terminal of the inverter X3 is connected to an input terminal of the inverter X2. The inverters X2 and X3 are driven with a potential difference between a voltage Vh and a ground voltage. Furthermore, VIN is the input signal node of the level shifter and DRV_N is the output signal node of the level shifter. The circuit in FIG. 1(c) operates similarly as the circuit in FIG. 1(b) does, which can be readily recognized by those of skill in the art. The purpose of R2 is to define the input of the latch to high level during high-impedance input.

The limitation of the voltage levels of FIG. 1(c) is as below:

$$\left. \begin{aligned} \text{when } DRV\_N = 0 &\Rightarrow Vh > \dfrac{Vh}{2} \\ \text{when } DRV\_N = Vh &\Rightarrow 0 < \dfrac{Vh}{2} \end{aligned} \right\} \Rightarrow Vh > 0$$

The detail operations of FIG. 1(b) and FIG. 1(c) are summarized in Table 1 below.

|  |  | Phase.1 | Phase.2 | Phase.1 | Phase.2 |
|---|---|---|---|---|---|
| High-side | VIP | '0' | '1' | '0' | '1' |
|  | V₁ | Vh | 0 | Vh | 0 |
|  | VX | Vh  VH | VH-Vh  VL | Vh+VL  VH | VH–Vh  VL |
|  | VC1 | 0 | VH-Vh | VL | VH-Vh  VL |
|  | DRV_P | VL | VH | VL | VH |
| Low-side | VIN | '0' | '1' | '0' | '1' |
|  | V₂ | Vh | 0 | Vh | 0 |
|  | VY | Vh | 0 | Vh | 0 |
|  | VC2 | 0 | 0 | 0 | 0 |
|  | DRV_N | 0 | Vh | 0 | Vh |

Figure 2:
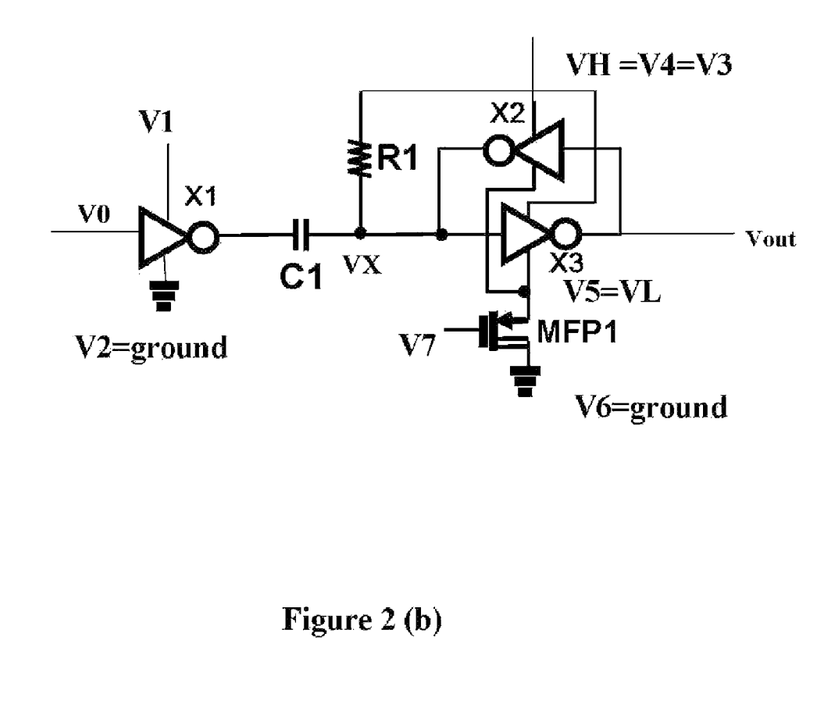
FIGS. 2(a)-(d) depict illustrative block diagrams of exemplary embodiments of level shifter circuits in various details, comprising an additional transistor compared to FIGS. 1(a)-(c)
Figure 2A:
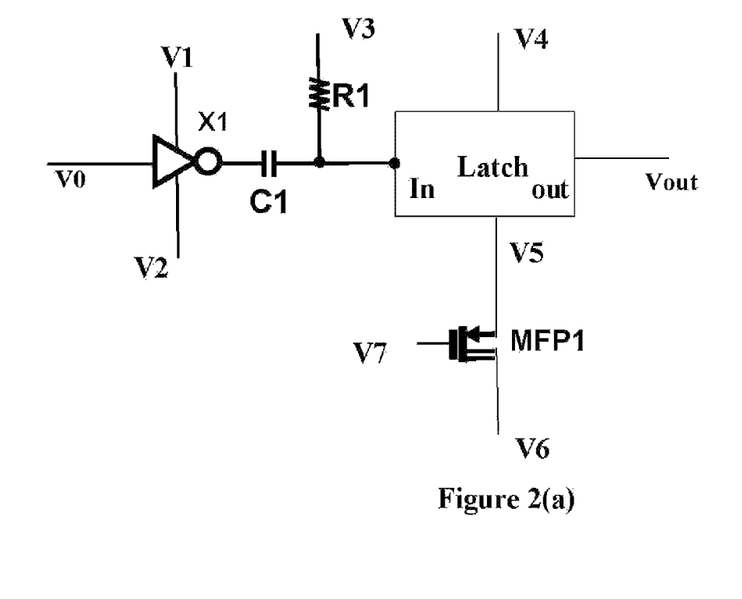

FIG. 2(a) illustrates a block diagram of an illustrative embodiment of a level-shifter circuit with a different reference voltage level by connecting to an additional voltage extension transistor. Compared to the illustrative block diagram in FIG. 1(a), the circuit in FIG. 2(a) comprises an additional P-transistor MFP1, wherein the voltage V5 signal node of the latch of the level shifter of FIG. 1(a) is connected to a first terminal of the P-transistor while a second terminal of the P-transistor is connected to a sixth voltage signal, and a gate of the P-transistor is connected to a seventh voltage signal. With the voltage extension transistor P-transistor, the new level shifter could operate under 7 different voltage signal connections V1 to V7, with V0 as the input voltage and Vout as the output voltage, which can be illustrated by an abstract block diagram also shown in FIG. 2(a).

FIG. 2(c) illustrates another exemplary block diagram of an illustrative embodiment of a level-shifter circuit with a different reference voltage level. Compared to the illustrative block diagram in FIG. 1(a), the circuit in FIG. 2(c) comprises an additional N-transistor MFN1, wherein the voltage V4 signal of the latch of the level shifter of FIG. 1(a) is connected to a first terminal of the N-transistor while a second terminal of the N-transistor is connected to a sixth voltage signal, and a gate of the N-transistor is connected to a seventh voltage signal. With the voltage extension transistor N-transistor, the new level shifter could operate under 7 different voltage signal connections V1 to V7, with V0 as the input voltage and Vout as the output voltage, which can be illustrated by an abstract block diagram also shown in FIG. 2(c).

Figure 2D:
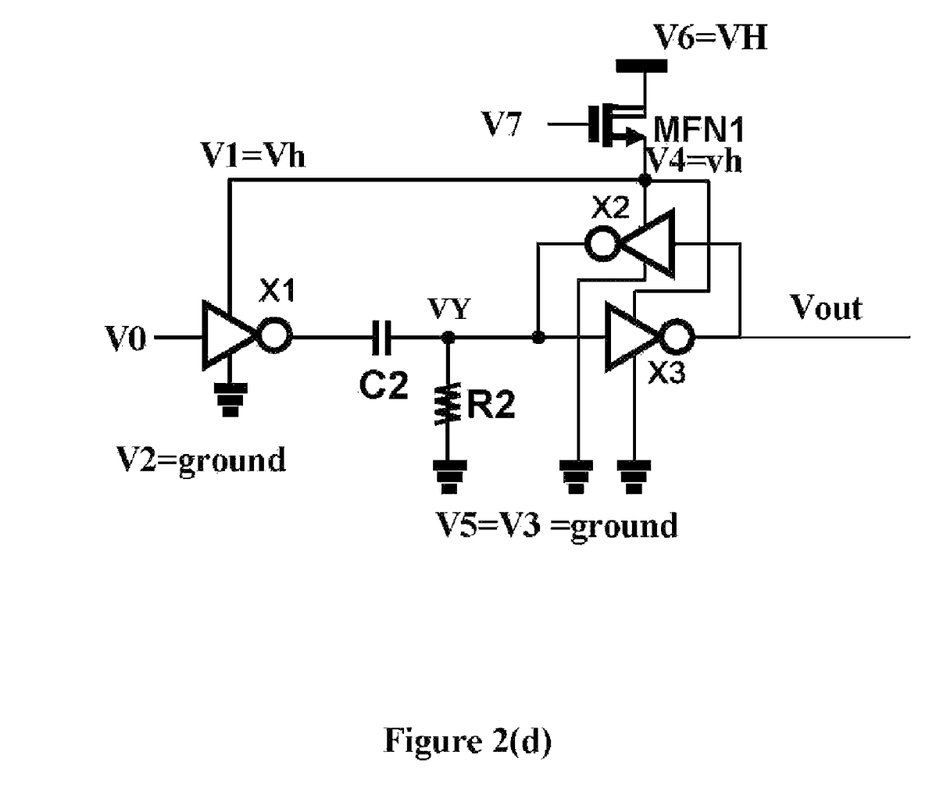

The level shifters in FIG. 2(a) and FIG. 2(c) can be illustratively implemented by circuits shown in FIG. 2(b) and FIG. 2(d) respectively. In both FIG. 2(b) and FIG. 2(d), the latch circuit of FIG. 2(a) and FIG. 2(c) is implemented by two inverters, wherein an output terminal of the first inverter X2 is connected to an input terminal of the second inverter X3 while an output terminal of the second inverter is connected to an input terminal of the first inverter. Other voltage signals of the circuit shown in FIG. 2(b) are similar to the voltage signals in circuit FIG. 1(b). Other voltage signals of the circuit shown in FIG. 2(d) are similar to the voltage signals in circuit FIG. 1(c). FIG. 2(b) can be viewed as adding to the circuit FIG. 1(b) a P-transistor to have a different reference voltage level for the circuit in FIG. 2(b) to operate. FIG. 2(d) can be viewed as adding to the circuit FIG. 1(c) an N-transistor to have a different reference voltage level for the circuit in FIG. 2(d) to operate.

Figure 3:
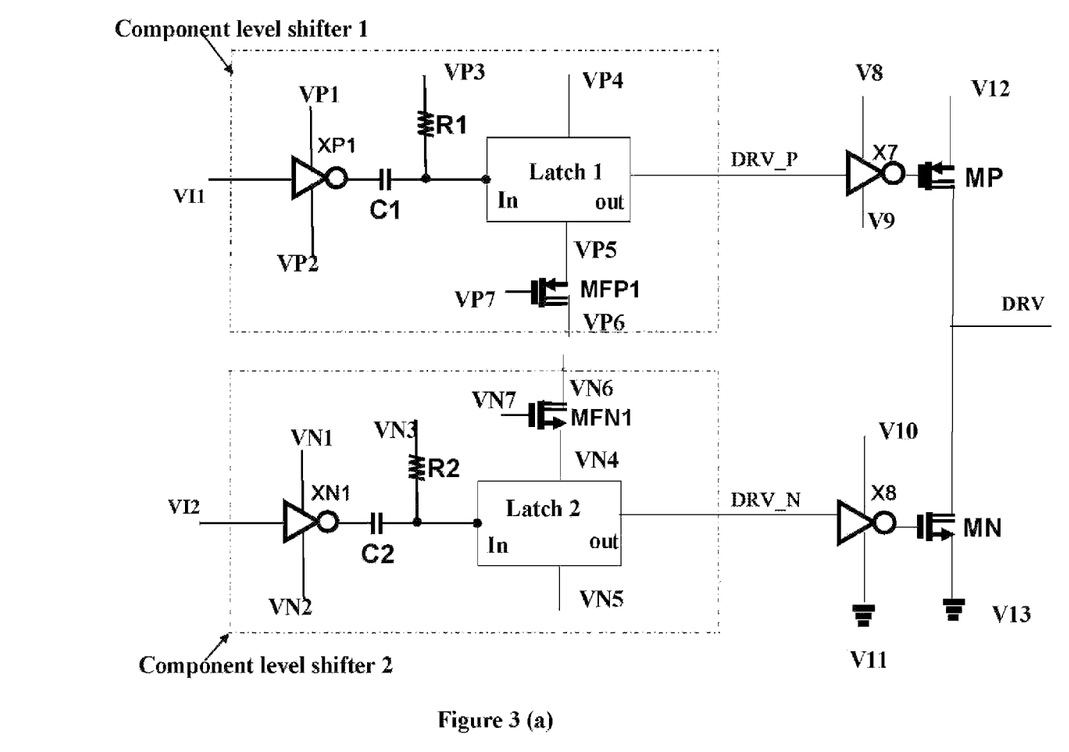
FIGS. 3(a)-(d) depict illustrative block diagrams of exemplary embodiments of level shifter circuits in various details, wherein the level shifter circuits comprising a first component level shifter circuit and a second component level shifter circuit which may receive two different inputs.

FIG. 3(a) illustrates a block diagram of an illustrative embodiment of a level-shifter circuit which comprises two component level shifters, wherein a first component level shifter is as shown in FIG. 2(a) and a second component level shifter is as shown in FIG. 2(c). The first component level shifter in FIG. 3(a) is an embodiment shown in FIG. 2(a) comprising the inverter XP1, latch 1, capacitor C1, resistor R1, and an extension transistor MFP1, with corresponding voltage signals VP1 to VP7. The second component level shifter in FIG. 3(a) is an embodiment shown in FIG. 2(c) comprising inverters XN1, latch 2, capacitor C2, resistor R2, and an extension transistor MFN1, with corresponding voltage signals VN1 to VN7. The new level shifter which could operate with two different input voltages V11 and V12 to the two component level shifters respectively, and produce one output voltage DRV. Furthermore, a first inverter X7 with an input terminal connected to an output voltage signal node DRV_P of the first component level shifter and an output terminal, driven by voltages V8 and V9. The output of inverter X7 is connected to a gate of a P-transistor MP, wherein MP has its first terminal connected a voltage V12, and its second terminal connected to the first output voltage of the device DRV. Moreover, a second component level shifter as shown in FIG. 2(c) is connected to the second input voltage V12 and the second component level shifter has an output node DRV_N, which operates according to the operations shown in FIG. 2(c). The output signal node DRV_N is connected to a second inverter X8 which is driven by voltages V10 and V11. The output node of the second inverter X8 is connected to a gate terminal of an N-transistor MN, wherein MN has its first terminal connected a voltage V13, and its second terminal connected to the first output voltage of the device DRV.

Figure 3B:
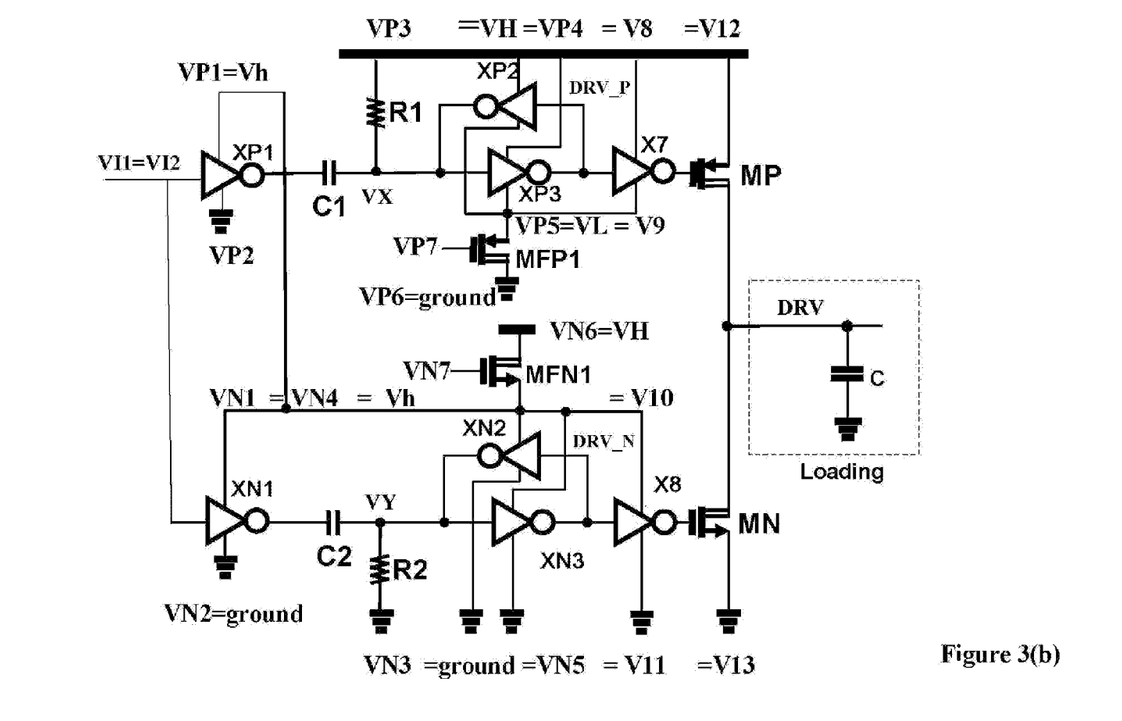

FIG. 3(b) illustrates a circuit diagram of a more detailed exemplary embodiment of a level-shifter circuit shown in FIG. 3(a) comprising two component level shifters. The first component level shifter in FIG. 3(b) is an embodiment shown in FIG. 2(b) comprising inverters XP1, XP2, XP3, capacitor C1, resistor R1, and an extension transistor MFP1, with corresponding voltage signals VP1 to VP7. The second component level shifter in FIG. 3(b) is an embodiment shown in FIG. 2(d) comprising inverters XN1, XN2, XN3, capacitor C2, resistor R2, and an extension transistor MFN1, with corresponding voltage signals VN1 to VN7. Other inverters X7 and X8, transistors MP and MN are the same as shown in FIG. 3(a). The same circuit diagram is also shown in another exemplary embodiment in FIG. 3(d). Furthermore, the two input voltage nodes V11 and V12 of FIG. 3(a) are connected together to form one voltage signal V11=V12 in FIG. 3(b), while V11 and V12 have an non-overlapping phase in FIG. 3(d).

Figure 3C:
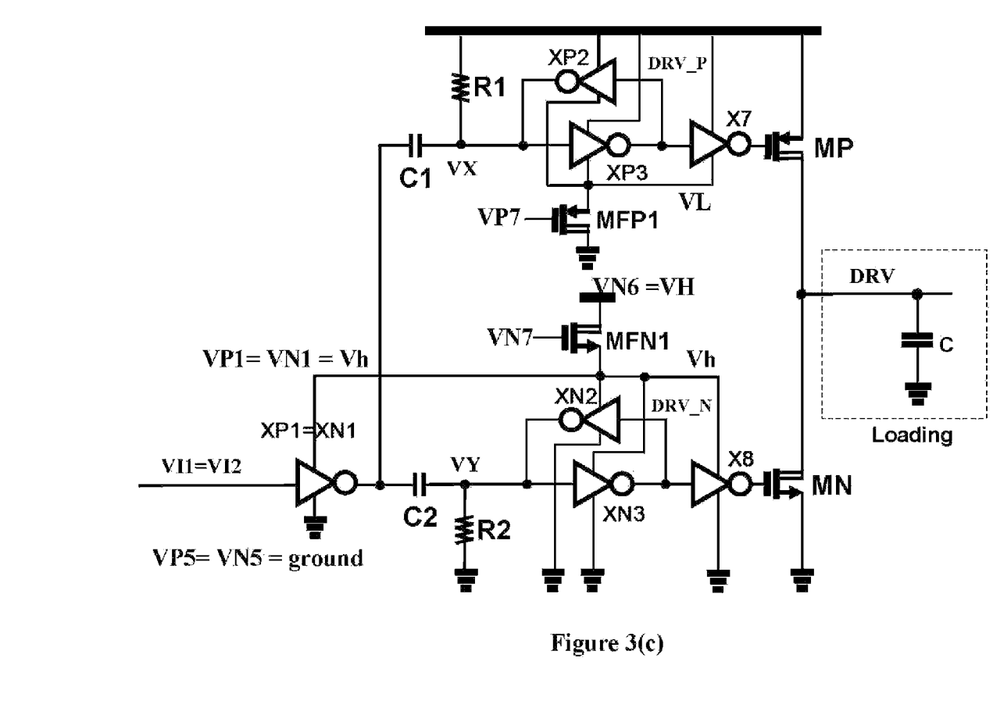
Figure 3D:
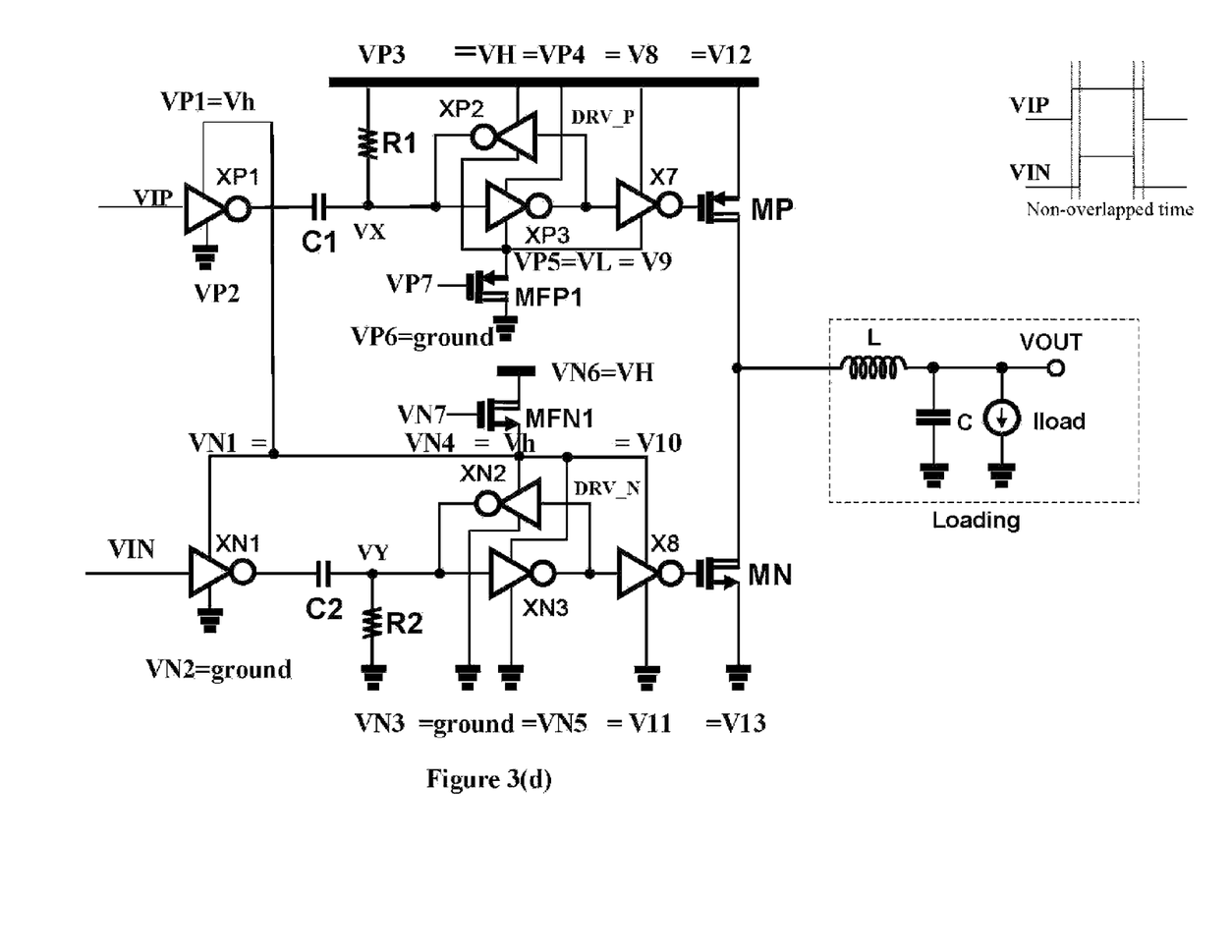

FIG. 3(b) and FIG. 3(d) are shown only as exemplary circuits of a level shifter illustratively shown in FIG. 3(a). Those of skill in the art will readily recognize that there are many variations which implement equivalent functions and the illustrative embodiments are made for illustrative purpose only. The latch can be implemented by other flip-flop circuits other than the two inverter loop as shown in the two component level shifters in FIG. 3(b) and FIG. 3(d).

Further circuit techniques can be applied to the exemplary circuits shown in FIG. 3(b) and FIG. 3(d) to form other different embodiments with equivalent functions. One such illustrative transformation is shown in FIG. 3(c), where the two component level shifters share one inverter XP1=XN1, since the two inverters XP1 and XN1 in FIG. 3(b) operate under the exact same condition with the same input and therefore their outputs should be the same. Those of skill in the art will readily recognize that there are many variations which implement equivalent functions.

Illustrative level shifter embodiments can be used in various system settings. FIG. 3(b) shows the output of the level shifter DRV is driving a capacitor load. Other load combinations of capacitor, resistor, and inductors can be driven by the output of the level shifter as shown in FIG. 3(d).

The level shifter circuits can be disposed in currently available technology such as in a semiconductor device or on a printed circuit board. The level shifter circuits can be disposed in future available technology as well.

Although the present embodiments and their advantages have been described in detail, it should be understood that various changes, substitutions and alterations can be made herein without departing from the spirit and scope of the disclosure as defined by the appended claims. For example, many of the features and functions discussed above can be implemented in software, hardware, or firmware, or a combination thereof. As another example, it will be readily understood by those skilled in the art that may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A level shifter configured to receive an input voltage signal and produce an output voltage signal comprising:
    a first inverter, configured to operate at a potential difference between a first voltage V1 received at a voltage V1 signal node and a second voltage V2 received at a voltage V2 signal node, the first inverter having an input terminal connected to an input node of the level shifter, and further having an output terminal;
    a capacitor having a first terminal connected to the output terminal of the first inverter, and further having a second terminal;
    a resistor having a first terminal connected to a third voltage V3 at a voltage V3 signal node and a second terminal; and
    a latch circuit, configured to operate at a potential difference between a fourth voltage V4 received at a voltage V4 signal node and a fifth voltage V5 received at a voltage V5 signal node, the latch having an input node connected to the second terminal of the resistor and the second terminal of the capacitor, and further having an output node connected to an output node of the level shifter.

2. The level shifter of claim 1, wherein a value of the input voltage signal of the level shifter is between a value of the voltage V1 and a value of the voltage V2, and a value of the output voltage signal of the level shifter is between a value of the voltage V4 and a value of the voltage V5.

3. The level shifter of claim 1, wherein the latch circuit has a plurality of inverters including a first latch inverter and a second latch inverter, wherein an output terminal of the first latch inverter is connected to an input terminal of the second latch inverter while an output terminal of the second latch inverter is connected to an input terminal of the first latch inverter.

4. The level shifter of claim 1, wherein a value of the voltage V4 is less than twice value of the voltage V1 minus a value of the voltage V5 while larger than V5.

5. The level shifter of claim 1, wherein a value of the voltage V3 can selectively be the same as a value of the voltage V4, or as a value of the voltage V5.

6. The level shifter of claim 1, wherein a value of the voltage V1 is the same as a value of the voltage V4.

7. The level shifter of claim 1, wherein a value of the voltage V2 is the same as a value of the voltage V5.

8. The level shifter of claim 1 further comprising a P-transistor, wherein the voltage V5 signal node is connected to a first terminal of the P-transistor while a second terminal of the P-transistor is connected to a sixth voltage V6 signal node, and a gate of the P-transistor is connected to a seventh voltage V7 signal node.

9. The level shifter of claim 1 further comprising an N-transistor, wherein the voltage V4 signal node is connected to a first terminal of the N-transistor while a second terminal of the N-transistor is connected to a sixth voltage V6 signal node, and a gate of the N-transistor is connected to a seventh voltage V7 signal node.

10. A device configured to receive a first input voltage signal at a first input node and a second input voltage signal at a second input node, and further produce an output comprising:
    a first inverter, configured to operate at a potential difference between a first voltage VP1 of the first inverter at a voltage VP1 signal node and a second voltage VP2 of the first inverter at a voltage VP2 signal node, the first inverter having an input terminal connected to the first input node of the device, and further having an output terminal;
    a first capacitor having a first terminal connected to the output terminal of the first inverter, and a second terminal;
    a first resistor having a first terminal connected to a third voltage VP3 of the first resistor at a voltage VP3 signal node and a second terminal;
    a first latch circuit, configured to operate at a potential difference between a fourth voltage VP4 of the first latch at a voltage VP4 signal node and a fifth voltage VP5 of the first latch at a voltage VP5 signal node, the latch having an input node connected to the second terminal of the first resistor and the second terminal of the first capacitor, and an output node;
    a first P-transistor, wherein the voltage VP5 signal node is connected to a first terminal of the first P-transistor while a second terminal of the first P-transistor is connected to a sixth voltage VP6 signal node of the first P-transistor, and a gate of the first P-transistor is connected to a seventh voltage VP7 signal node of the first P-transistor;
    a first latch output inverter with an input terminal connected to the output terminal of the first latch, and an output terminal, driven by voltages V8 and V9 at a voltage V8 signal node and a voltage V9 signal node respectively;
    a second P-transistor with its gate connected to the output terminal of the first latch output inverter, its first terminal connected a voltage V12 signal node, and its second terminal connected to the output of the device;
    a second inverter, configured to operate at a potential difference between a first voltage VN1 of the second inverter at a voltage VN1 signal node and a second voltage VN2 of the second inverter at a voltage VN2 signal node, the second inverter having an input terminal connected to a second input node of the device, and further having an output terminal;
    a second capacitor having a first terminal connected to the output terminal of the second inverter, and a second terminal;

a second resistor having a first terminal connected to a third voltage VN3 of the second transistor at a voltage VN3 signal node and a second terminal;

a second latch circuit, configured to operate at a potential difference between a fourth voltage VN4 of the second latch at a voltage VN4 signal node and a fifth voltage VN5 of the second latch at a voltage VN5 signal node, and further having an input node connected to the second terminal of the second resistor and the second terminal of the second capacitor, and an output node;

a first N-transistor, wherein the voltage VN4 signal node is connected to a first terminal of the first N-transistor while a second terminal of the first N-transistor is connected to a sixth voltage VN6 signal node of the first N-transistor, and a gate of the first N-transistor is connected to a seventh voltage VN7 signal node of the first N-transistor;

a second latch output inverter with an input terminal connected to the output of the second latch and an output terminal, driven by voltages V10 and V11 at a voltage V10 signal node and a voltage V11 signal node respectively; and a second N-transistor with its gate connected to the output terminal of the second latch output inverter, its first terminal connected a voltage V13 signal node, and its second terminal connected to the output of the device.

11. The device of claim 10, wherein the first input voltage signal node of the device connected to the first inverter is the same as the second input voltage signal node of the device connected to the second inverter.

12. The device of claim 11, wherein the first inverter is the same as the second inverter.

13. The device of claim 10, wherein the voltage VN1 signal node and the voltage VN4 signal node are the same; and the voltage VN2 signal node, the voltage VN3 signal node, and the voltage VN5 are the same.

14. The device of claim 10, wherein the voltage VP4 signal node and the voltage VP3 signal node are the same, while the voltage VP6 signal node and the voltage VP2 signal node are the same.

15. The device of claim 10, wherein the voltage VP1 signal node and the voltage VN1 signal node are the same.

16. The device of claim 10, wherein the voltage V8 signal node and V12 signal node are the same as the voltage VP4 signal node.

17. The device of claim 10, wherein the first input voltage signal of the device received by the first inverter has a non-overlapping phase from the second input voltage signal of the device received by the second inverter.

18. A method of operating a level shifter circuit configured to receive an input voltage signal and produce an output voltage signal comprising:

receiving the input voltage signal by a first inverter operating at a potential difference between a first voltage V1 and a second voltage V2 and inverting the input voltage signal, with an output terminal connected to a first terminal of a capacitor;

capacitively coupling the inverted input voltage signal by the capacitor to an input of a latch circuit;

maintaining a desired voltage on the input of the latch by coupling the input of the latch to a voltage source via a resistor; and generating the output voltage signal by the latch operating at a potential difference between a fourth voltage V4 and a fifth voltage V5.

19. The method of claim 18, further comprising:

connecting selectively either the fifth voltage V5 signal or the fourth voltage V4 signal to a first terminal of an extension transistor while connecting a second terminal of the extension transistor to a sixth voltage signal, and controlling a gate of the extension transistor by a seventh voltage signal.

20. The method of claim 19, further comprising:

receiving by a first component level shifter which operates according to the method of claim 19 to receive a first input voltage signal, and producing an output voltage signal of the first component level shifter, wherein the extension transistor is a P-transistor and the voltage V5 of the first component level shifter is connected to a first terminal of the P-transistor;

receiving by a first inverter driven by voltages V8 and V9 the output voltage signal of the first component level shifter and producing an output of the first inverter;

receiving by a second P-transistor the output of the first inverter, wherein the second P-transistor has its first terminal connected a voltage V12, and its second terminal connected to a first output voltage;

receiving a second input voltage signal by a second component level shifter operating according to the method of claim 19, wherein the extension transistor is an N-transistor and the voltage V4 of the second component level shifter is connected to a first terminal of the N-transistor;

receiving by a second inverter driven by voltages V10 and V11 the output voltage signal of the second component level shifter; and receiving by a second N-transistor with its gate connected to the output terminal of the second inverter, its first terminal connected a voltage V13, and its second terminal connected to the first output voltage.

21. The method of claim 20, wherein:

the P-transistors and N-transistors are drain-extended devices respectively.

* * * * *